(12) United States Patent
Schafer et al.

(10) Patent No.: US 6,197,666 B1
(45) Date of Patent: Mar. 6, 2001

(54) METHOD FOR THE FABRICATION OF A DOPED SILICON LAYER

(75) Inventors: Herbert Schafer, Höhenkirchen-Sieg Brunn; Martin Franosch, München; Reinhard Stengl, Stadtbergen; Hans Reisinger, Grünwald, all of (DE); Matthias Ilg, Richmond, VA (US)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/390,496

(22) Filed: Sep. 3, 1999

(30) Foreign Application Priority Data

Sep. 3, 1998 (DE) .............................. 198 40 238

(51) Int. Cl.$^7$ .................................. H01L 21/20
(52) U.S. Cl. .............................................. 438/509
(58) Field of Search .................... 438/478, 482, 438/486, 488, 507, 509; 427/248.1, 249.15, 255.11, 255.18, 255.28, 124, 255.393

(56) References Cited

U.S. PATENT DOCUMENTS 5,700,520 * 12/1997 Beinglass et al. .................. 427/124
5,786,027 * 7/1998 Rolfson ......................... 427/255.393

FOREIGN PATENT DOCUMENTS

| 59-052251 | 3/1984 | (JP) . |
| 01109715 | 4/1989 | (JP) . |
| 9410521 | 10/1994 | (KR) . |

OTHER PUBLICATIONS

"Technologie hochintegrierter Schaltungen", D. Widmann et al., Springer–Verlag, Berlin, Heidelberg, New York, London, Paris, Tokyo, 1988, pp. 95, 96, 215, 216.

* cited by examiner

Primary Examiner—Charles Bowers
Assistant Examiner—Keith Christianson
(74) Attorney, Agent, or Firm—Herbert L. Lerner; Laurence A. Greenberg; Werner H. Stemer

(57) ABSTRACT

A method for the fabrication of a doped silicon layer, includes carrying out deposition by using a process gas containing $SiH_4$, $Si_2H_6$ and a doping gas. The doped silicon layer which is thus produced can be used both as a gate electrode of an MOS transistor and as a conductive connection. At a thickness between 50 and 200 nm it has a resistivity less than or equal to 0.5 mΩcm.

12 Claims, 2 Drawing Sheets

METHOD FOR THE FABRICATION OF A DOPED SILICON LAYER

BACKGROUND OF THE INVENTION

Field of the Invention

The invention relates to a method for the fabrication of a doped silicon layer.

Low-impedance conductive elements are needed in a diversity of applications, for example as contacts or electrodes. Examples of such applications are a gate electrode of an MOS transistor in a CMOS configuration or a selector transistor in a DRAM, a contact for a bipolar transistor or a conductive connection between a selector transistor and a storage capacitor in a DRAM memory cell.

The use of conductive elements containing a silicide layer is known for applications of that kind (see, for example, a book entitled "Technologie hochintegrierler Schaltungen" [Technology of Large-Scale Integrated Circuits], by D. Widmann et al., Springer Verlag 1988, pages 95–96 and 215–216). The use of silicide requires additional equipment and it furthermore increases the costs of the fabrication process as a result.

SUMMARY OF THE INVENTION

It is accordingly an object of the invention to provide a method for the fabrication of a doped silicon layer, which overcomes the hereinafore-mentioned disadvantages of the heretofore-known methods of this general type and which can be used in the fabrication of low-impedance conductive elements as well as a microelectronic structure with a low-impedance conductive element.

With the foregoing and other objects in view there is provided, in accordance with the invention, a method for the fabrication of a doped silicon layer, which comprises depositing a silicon layer by using a process gas containing $SiH_4$, $Si_2H_6$ and a doping gas; and carrying out the deposition in a CVD reactor within a temperature range between 600° C. and 680° C. and within a pressure range between 100 torr and atmospheric pressure.

It was established that, in the method, the addition of $Si_2H_6$ to a process gas containing $SiH_4$ and a doping gas promotes the incorporation of dopant into the deposited silicon layer. In this way lower resistivities are achieved in the deposited layer than would be the case when using a process gas containing $SiH_4$ and a doping gas. The addition of $Si_2H_6$ also increases the rate of deposition. Thus the method achieves lower resistivities at higher deposition rates.

In accordance with another mode of the invention, the ratio of $Si_2H_6$ to $SiH_4$ preferably has a value between 1:1.5 and 1:6. The ratio of $Si_2H_6$ to $SiH_4$ is preferably 1:3 to 1:6. The doped silicon layer deposited according to this method is essentially polycrystalline.

In accordance with a further mode of the invention, an activation of the dopant preferably takes place through heat treatment after the deposition. The heat treatment is carried out in a temperature range between 1000° C. and 1200° C., preferably between 1050° C. and 1100° C.

In accordance with an added mode of the invention, the doped silicon layer is especially suitable as a starting material for the fabrication of a conductive element of doped silicon that has a resistivity less than or equal to 0.5 mΩcm at a layer thickness between 50 nm and 200 nm. In this case the ratio of $Si_2H_6$ to $SiH_4$ during deposition is set at 1:3 to 1:6.

Due to its resistivity, the conductive element can be used as a gate electrode, a bipolar contact or a connection between electrical components. Due to the deposition rate of 50 nm per minute achieved in the method according to the invention, the conductive element can be fabricated inexpensively.

In accordance with an additional mode of the invention, the conductive element can be disposed on any required surface, especially on a level surface, above a step, or in a trench.

In accordance with a concomitant mode of the invention, when depositing the doped silicon layer above a step in a surface of a substrate, a good conformity is achieved in covering the edge of the step. The conformity, i.e. the ratio of the thickness of the layer at the essentially vertical surfaces to the thickness of the layer at the essentially horizontal surfaces, is at least 50 percent.

Other features which are considered as characteristic for the invention are set forth in the appended claims.

Although the invention is illustrated and described herein as embodied in a method for the fabrication of a doped silicon layer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
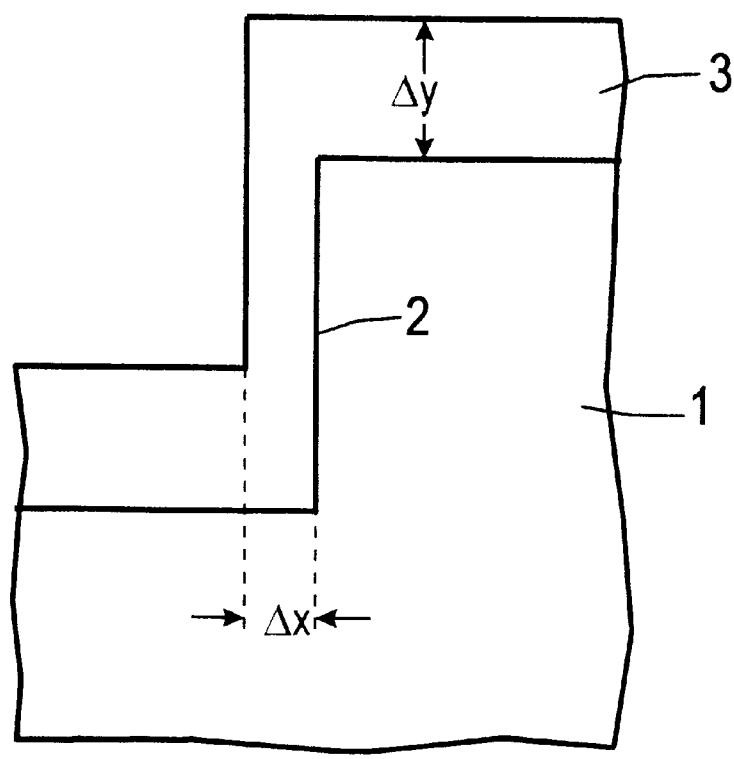
FIG. 1 is a fragmentary, diagrammatic, cross-sectional view of a substrate on which a doped silicon layer has been deposited.

Referring now to the figures of the drawings in detail and first, particularly, to FIG. 1 thereof, there is seen a doped silicon layer 3 which is deposited on a substrate 1 of monocrystalline silicon in a CVD process. The substrate 1 includes a main surface having a step with a side 2 essentially perpendicular to the main surface. A process gas which is used for this purpose contains $SiH_4$, $Si_2H_6$, $PH_3$ and $H_2$ or $N_2$ as a carrier gas. The flow of $SiH_4$ is 295 sccm, the flow of $Si_2H_6$ is 100 sccm and the flow of $PH_3$ is 295 sccm. At a deposition temperature of 650° C. and a pressure of 650 torr, the doped silicon layer 3 is deposited in a thickness of 159 nm with a deposition rate of 53 nm per minute. In this way a dopant concentration of $1.8 \times 10^{21}$ cm$^{-3}$ is achieved. After activation by heating at 1050° C., the doped silicon layer 3 a resistivity ρ of 0.46 mΩcm. The conformity of the deposition is 58 percent. The conformity is defined as the quotient of a thickness Δx of the doped silicon layer 3 at the side 2 and a thickness Δy of the doped silicon layer 3 at the horizontal surface of the substrate 1.

If the deposition proceeds with the same parameters and an activation heat treatment is carried out at 1100° C., a resistivity ρ of 0.402 mΩcm is achieved at a layer thickness of 156 nm.

If the doped silicon layer is deposited through the use of a process according to the state of the art in which only $SiH_4$ without $Si_2H_6$ is used in the process gas, a deposition rate of 16 nm per minute is achieved with a flow of 295 sccm of $SiH_4$, 295 sccm of $PH_3$ and 13 liters of carrier gas containing $H_2$. After activation heat treatment at 1100° C. with a layer thickness of 58 nm, a dopant concentration of $1.3 \times 10^{21}$ cm$^{-3}$ and a resistivity $\rho$ of 0.510 mΩcm is achieved.

The conformity $\Delta x/\Delta y$ is increased by reducing the proportion of the doping gas. Thus a conformity $\Delta x/\Delta y$ of 86 percent is achieved in a deposition with 295 sccm $SiH_4$, 100 sccm $Si_2H_6$ and 50 sccm $PH_3$. A conformity $\Delta x/\Delta y$ of 90 percent is achieved in a deposition with 295 sccm $SiH_4$, 100 sccm $Si_2H_6$ and 5 sccm $PH_3$.

Upon deposition of the doped silicon layer 3 with 295 sccm $SiH_4$, 20 sccm $Si_2H_6$, 295 sccm $PH_3$ and 13 liters of $H_2$ a deposition rate of 21 nm per minute is observed. After activation heat treatment at 1100° C. with a layer thickness of 105 nm, a dopant concentration of $1.6 \times 10^{21}$ cm$^{-3}$ and a resistivity $\rho$ of 0.54 mΩcm is achieved.

Upon deposition of the doped silicon layer 3 with 295 sccm $SiH_4$, 200 sccm $Si_2H_6$, 295 sccm $PH_3$ and 13 liters of $H_2$ a deposition rate of 102 nm per minute is observed. After activation heat treatment at 1050° C. with a layer thickness of 152 nm, a dopant concentration of $1.05 \times 10^{21}$ cm$^{-3}$ and a resistivity $\rho$ of 0.51 mΩcm is achieved.

Figure 2:
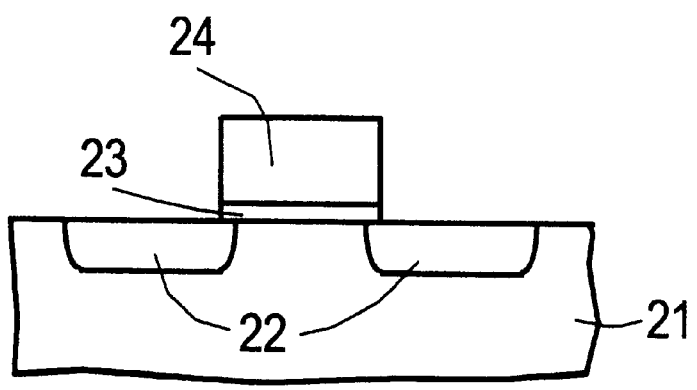
FIG. 2 is a fragmentary, cross-sectional view of an MOS transistor.

The doped silicon layer 3 has an essentially polycrystalline grain structure. As is seen in FIG. 2, through deposition of a doped silicon layer in a CVD process and subsequent structuring of the doped silicon layer, a gate electrode 24 is formed through addition of the $Si_2H_6$ into an MOS transistor. The MOS transistor has source/drain regions 22 in a silicon substrate 21 and has a gate oxide layer 23 at a surface of the silicon substrate 21. The doped silicon layer is deposited in a CVD process with $SiH_4$, $Si_2H_6$, $PH_3$ and $H_2$ as a process gas. The gas flows which are used are:

| | |
|---|---|
| $SiH_4$: | 295 sccm |
| $Si_2H_6$: | 100 sccm |
| $H_2$: | 13 liters. |

The deposition temperature is 650° C. and the deposition pressure is 650 torr. The doped silicon layer is created at a deposition rate of 52 nm per minute in a layer thickness of 156 nm. After heat treatment at 1100° C. it has a dopant concentration of $1.8 \times 10^{21}$ cm$^{-3}$ and a resistivity $\rho$ of 0.402 mΩcm. Structuring of the doped silicon layer is performed through anisotropic etching, for example with $Cl_2$, HBr. The MOS transistor is especially suitable as a selector transistor in a DRAM memory cell.

Figure 3:
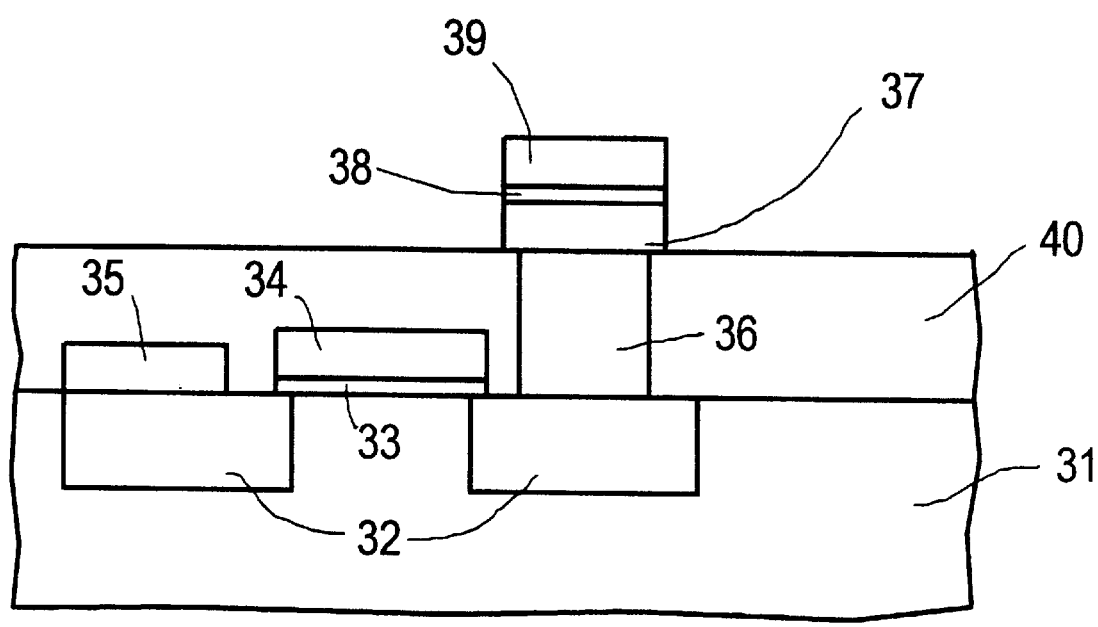
FIG. 3 is a fragmentary, cross-sectional view of a DRAM memory cell.

A memory cell has a selector transistor and a storage capacitor. According to FIG. 3, two source/drain regions 32 of the selector transistor are provided in a silicon substrate 31. A gate oxide 33 and a gate electrode 34 of the selector transistor are provided at a surface of the silicon substrate 31. One of the source/drain regions 32 is connected to a bit line. The other source/drain region 32 is connected over a conductive connection 36 with a first electrode 37 of the storage capacitor. In addition, the storage capacitor includes a memory dielectric 38 and a second electrode 39. The conductive connection 36 is completely surrounded by an intermediate oxide layer 40.

A contact hole is opened in the intermediate oxide layer 40 in order to make the conductive connection 36. The contact hole is filled through deposition of a doped silicon layer followed by planarization. The doped silicon layer is deposited in a CVD process using a process gas that contains $SiH_4$, $Si_2H_6$, $PH_3$ and $H_2$. The gas flows which are used are:

| | |
|---|---|
| $SiH_4$: | 295 sccm |
| $Si_2H_6$: | 100 sccm |
| $PH_3$: | 5 sccm |
| $H_2$: | 13 liters. |

The deposition temperature is 650° C. and the deposition pressure is 650 torr.

Deposition proceeds with a deposition rate of 52 nm per minute. After the deposition an activation heat treatment is carried out at 1100° C.

A conformity of 90 percent is achieved with these process parameters. As a result, the contact hole in the intermediate oxide layer 40 is filled out free of cavities.

The method for deposition of a doped silicon layer was described by using the example of an n-doping with phosphorus. The method according to the invention can also be performed for an n-doped silicon layer with arsenic as a dopant and for a p-doped silicon layer with boron as a dopant. In this case $AsH_3$ and $B_2H_6$ are used, respectively.

We claim:

1. A method for the fabrication of a doped silicon layer, which comprises:
   depositing a silicon layer by using a process gas containing $SiH_4$, $Si_2H_6$ and a doping gas; and
   carrying out the deposition in a CVD reactor within a temperature range between 600° C. and 680° C. and within a pressure range between 100 torr and atmospheric pressure.

2. The method according to claim 1, which comprises setting a ratio of $Si_2H_6$:$SiH_4$ between 1:1.5 and 1:6 in the process gas.

3. The method according to claim 1, which comprises placing a substance selected from the group consisting of phosphine, diborane and arsine in the doping gas.

4. The method according to claim 1, which comprises carrying out the step of depositing the silicon layer in a thickness between 50 and 200 nm.

5. The method according to claim 1, which comprises carrying out the step of depositing the silicon layer above a step in a surface of a substrate with a conformity of an edge coverage of at least 50 percent.

6. The method according to claim 1, which comprises carrying out a heat treatment at a temperature between 1000 and 1200° C., after the deposition of the doped silicon layer.

7. The method according to claim 1, which comprises carrying out the step of depositing the silicon layer as a conductive element of doped silicon having a thickness between 50 and 200 nm and a resistivity at most equal to 0.5 mΩcm.

8. The method according to claim 7, which comprises carrying out the step of depositing the conductive element above a step in a surface of a substrate and covering the step with a conformity of an edge covering of at least 50 percent.

9. The method according to claim 7, which comprises carrying out the step of depositing the conductive element as a gate electrode of an MOS transistor.

10. The method according to claim 8, which comprises carrying out the step of depositing the conductive element as a gate electrode of an MOS transistor.

11. The method according to claim 7, which comprises carrying out the step of depositing the conductive element as a conductive connection between a selector transistor and a storage capacitor in a DRAM memory cell.

12. The method according to claim 8, which comprises carrying out the step of depositing the conductive element as a conductive connection between a selector transistor and a storage capacitor in a DRAM memory cell.

* * * * *